United States Patent [19]

Ngo et al.

[11] Patent Number: 5,990,710
[45] Date of Patent: Nov. 23, 1999

[54] HIGH PERFORMANCE WRITE DRIVER FOR MAGNETIC INDUCTIVE RECORDING HEAD

[75] Inventors: Tuan V. Ngo, Eden Prairie; Raymond E. Barnett, Rosemount, both of Minn.

[73] Assignee: VTC, Inc., Bloomington, Minn.

[21] Appl. No.: 08/867,097

[22] Filed: Jun. 2, 1997

Related U.S. Application Data

[60] Provisional application No. 60/022,476, Jun. 13, 1996.

[51] Int. Cl.[6] .................................................. H03B 1/00
[52] U.S. Cl. ............................ 327/110; 327/374; 363/63
[58] Field of Search .................................... 327/110, 423, 327/424, 448, 508, 374–377; 363/58, 63; 330/146; 360/46, 67, 68

[56] References Cited

U.S. PATENT DOCUMENTS

| | | | |
|---|---|---|---|
| 5,282,094 | 1/1994 | Ngo | 360/46 |
| 5,287,231 | 2/1994 | Shier et al. | 360/68 |
| 5,386,328 | 1/1995 | Chiou et al. | 360/68 |
| 5,532,631 | 7/1996 | Ngo et al. | 327/110 |
| 5,534,818 | 7/1996 | Peterson | 327/545 |
| 5,539,342 | 7/1996 | Gersbach et al. | 327/110 |

OTHER PUBLICATIONS

"Read/Write Amplifier Design Considerations for MR Heads" by K.B. Klaassen et al, *IEEE Transactions on Magnetics*, vol. 31, No. 2, Mar. 1995.

"A Resonant Switching Write Driver for Magnetic Recording" by R. J. Reay et al, *IEEE Journal of Solid–State Circuits*, Vol. 32, No. 2, Feb. 1997.

"A Low–Power 3V–5.5V Read/Write Preamplifier for Rigid–Disk Drives" by T. Ngo et al, *ISSCC94/Session 17/Disk–Drive Electronics/Paper FA 17.6. 1994 IEEE International Solid–State Circuit Conference*.

*Primary Examiner*—Kenneth B. Wells
*Assistant Examiner*—Minh Nguyen
*Attorney, Agent, or Firm*—Kinney & Lange

[57] ABSTRACT

A circuit is provided to switch a drive transistor in a write driver circuit controlled by a write control signal to direct write current in a selected direction through an inductive head. Current is selectively conducted from a control region of the drive transistor in response to switching of the write control signal. A first bias circuit limits voltage fluctuation at the control region of the drive transistor. A second bias circuit prevents saturation of the drive transistor.

9 Claims, 2 Drawing Sheets

HIGH PERFORMANCE WRITE DRIVER FOR MAGNETIC INDUCTIVE RECORDING HEAD

CROSS-REFERENCE TO RELATED APPLICATION

This application claims priority from Provisional Application No. 60/022,476 filed Jun. 13, 1996 for "Write Driver With Improved Speed For Magnetic Inductive Head" by T. Ngo and R. Barnett.

BACKGROUND OF THE INVENTION

The present invention relates to a magnetic head read/write preamplifier within a magnetic storage system, and particularly to a write driver circuit within the read/write preamplifier having improved switching speed, improved rise/fall time, reduced write current ringing, and reduced asymmetry.

In magnetic data storage systems, a magnetic read/write head is operable to write binary data, representing ones and zeros, onto a magnetic medium such as a magnetic tape or disc. The head uses an inductive coil to generate magnetic fields, which form magnetic patterns on the medium representing the ones and zeros. The orientation of the patterns depends on the direction of electrical current flow through the inductive coil, so that writing the binary data entails selectively changing, or reversing, the direction of current flow through the head. Changing the direction of current flow through the coil is the function of a write driver.

The write driver includes a drive circuit, coupled to the head, and a control circuit for operating the drive circuit in response to control data signals. Conventionally, the drive circuit is configured as an H-switch, which has a pair of forward switches and a pair of reverse switches. (The term H-switch stems from the H-shaped arrangement of the four switches and the head in electrical schematics.) The control circuit is conventionally responsive to a pair of complementary, or differential, control data signals to selectively open and close the forward and reverse switches of the H-switch, thereby changing the direction of current through the head to write a specific bit pattern on the magnetic medium.

The major components of the write driver are usually formed from transistors, which serve as switches. For example, FIG. 1 shows a typical write driver 10 coupled to a head 11 that includes an inductive coil $L_H$. Write driver 10 includes an H-switch drive circuit 12 and a differential control circuit 14. The H-switch drive circuit, connected between opposite supply terminals such as $V_{CC}$ and ground, includes four drive transistors Q1–Q4, two head terminals 16 and 18, and a write current source $I_W$. Transistors Q1 and Q4 serve as forward switches, and transistors Q2 and Q3 serve as reverse switches.

Differential control circuit 14 comprises control transistors Q5 and Q6, pull-up resistors R1 and R2, and pre-driver control current source $I_D$, and operates the forward and reverse switches Q1–Q4 in response to write control signals at write control inputs $V_X$ and $V_Y$. Specifically, when input $V_Y$ is a higher voltage than input $V_X$, control circuit 14 closes, or turns on, control transistor switch Q5, and opens, or turns off, control transistor switch Q6. This arrangement turns on the forward switches Q2 and Q3 and turns off the reverse switches Q1 and Q4. As a result, current $I_W$ flows from $V_{CC}$ through switch Q2, head 11 from terminal 18 to terminal 16, and switch Q3 into the ground of the circuit. Conversely, when input $V_X$ is at a higher voltage than input $V_Y$, control circuit 14 turns on control transistor switch Q5 and turns off control transistor switch Q6, thereby turning on the reverse switches and turning off the forward switches. This directs write current $I_W$ through switch Q1, head 11 from terminal 16 to terminal 18, and switch Q4 into the ground of the circuit. Thus, changing the relative voltage levels at inputs $V_X$ and $V_Y$ changes the direction of write current flow through head 11.

In practice, the write driver of FIG. 1 suffers from two problems. First, its constituent transistors have inherent switching speed limitations which inhibit the write driver and head from writing data as quickly and as densely as is necessary in high performance data storage systems. Second, the current flowing through the head immediately following a change in the direction of current flow tends to "overshoot" the desired value of write current, resulting in an additional delay for the write current to settle at its desired value after a transition.

The transistors forming the write driver suffer from switching limitations. Unlike ideal switches, transistors have inherent structural, or parasitic, capacitances which prevent them from instantaneously opening (turning off) or closing (turning on). These capacitances charge or discharge while opening or closing the transistor switch, and thus slow or delay the opening and closing of the transistor switch. The delays in opening and closing not only limit how fast bits are written but ultimately how closely the bits are spaced on a magnetic medium. The closeness of the bits, which is known as bit density, is a factor in the data capacity of a magnetic medium.

One particular aspect of this switching limitation or problem concerns transistors Q1–Q4, the four drive transistors of the H-switch drive circuit. These transistors have a larger surface area than control circuit transistors Q5 and Q6, enabling them to conduct the relatively large write current necessary for operating the write head. Larger transistors generally have larger inherent capacitances, which require more time to charge and discharge than do smaller capacitances. Thus, within the write driver, the four H-switch drive transistors Q1–Q4 are a significant factor limiting switching speed and bit density.

To alleviate the switching limitations of the H-switch drive transistors, artisans have sought to increase the capacity of control circuit 14 to rapidly charge and discharge the larger inherent capacitances of these transistors and thereby reduce their turn-on and turn-off times. There are several known approaches for increasing the current charging the drive transistors and thereby reducing their turn-on times.

One approach entails increasing current flow through resistors R1 and R2, known as pull-up resistors. Unfortunately, increasing the current flow through resistors R1 and R2 also reduces the voltage across the write head, known as head swing, which in turn reduces switching speed. Head swing determines the rate of change of current in the write head, which in turn determines how fast current in the write head itself can actually start, stop, and reverse direction in writing individual data bits. Reducing head swing therefore reduces switching speed. This approach is especially inadequate in low-voltage applications where any reduction in head swing significantly reduces switching speed.

A second approach entails connecting separate NPN emitter-follower circuits between the respective pull-up resistors R1 and R2 and the respective bases, or control nodes, of drive transistors Q1 and Q2. More particularly, an NPN emitter-follower includes an NPN transistor with its base connected to pull-up resistor R1, its collector coupled to the positive voltage supply terminal $V_{CC}$, and its emitter coupled to the base of transistor Q1 and to the ground terminal through a pull-down resistor. When activated, the NPN transistor drives an emitter current into the base of upper drive transistor Q1 that rapidly charges the capacitance of transistor Q1 and thus accelerates its turn-on. When deactivated, the NPN transistor allows the capacitance of upper drive transistor Q1 to passively discharge through the pull-down resistor to the ground terminal. The counterpart emitter-follower between resistor R2 and the control node of upper drive transistor Q2 operates similarly. Unlike the first approach of increasing current flow in the pull-up resistors, the NPN emitter-follower circuits improve the turn-on times of the upper drive transistors without diminishing head-swing. However, this approach is also inadequate because it improves only the turn-on times, and not the turn-off times of the upper drive transistors.

A third approach entails connecting separate PNP pull-down transistor circuits between the respective control nodes of transistors Q3 and Q4 and the ground terminal of the circuit. A write driver incorporating this technique is described in U.S. Pat. No. 5,532,631 (Ngo et al.), which is hereby incorporated by reference herein. This technique alternately supplies base current to the switching drive transistors to charge their parasitic capacitances and sinks base current from the switching drive transistors to discharge their parasitic capacitances.

A technique for improving both the turn-on and the turn-off times of the drive switching transistors entails charging and discharging their capacitances using respective MOSFET (metal-oxide-semiconductor field effect transistor) inverters. A write driver incorporating this technique is shown in U.S. Pat. No. 5,296,975 (Contreras). Contreras, however, uses both bipolar junction transistors and MOSFETs which makes it more complicated to manufacture than a pure bipolar or MOS design. Thus, even though the Contreras write driver includes MOS inverters for charging and discharging the capacitances of its upper drive transistors, its complexity and manufacture are significant drawbacks.

In addition to the inherent switching limitation of the drive transistors, the write driver of FIG. 1 also suffers from the second problem of the write current "overshooting" the desired value immediately following a change in current flow direction through the head. Specifically, during the starting and stopping and reversing of write current direction, the inductive coil in the write head inevitably exhibits a phenomenon, known as self-inductance, which produces a transient voltage, that is, a voltage spike, across the write head. The voltage spike, commonly called kickback, typically produces a ringing, or oscillating, voltage that lasts several nanoseconds before decaying to a negligible magnitude. These voltage spikes cause excessive write current to flow through the head following a reversal in the direction of current flow, to overcome the inductive coil's resistance to the current direction change. As a result, the write current exceeds its desired value and an additional delay time, known as settling time, is required for the oscillating write current to settle to the desired value. The additional delay slows total transition time and thereby inhibits the density of bit recording on the magnetic medium, which is desirably as high as possible.

One known solution to the ringing problem has been to connect a damping resistor across the terminals of the write head. The resistive damping reduces the settling time for the write current flowing through the head. However, resistive damping has several negative effects on the performance of the write circuit. Since some of the write current is diverted through the damping resistor, write current through the head is reduced. To achieve the desired value of write current through the head, more current must be generated to flow through both the head and the damping resistor. More importantly, the damping resistor slows the rise/fall times for write current transitions. This can adversely affect bit density. While resistive damping generally does reduce settling time, the slower rise/fall times may not be acceptable for high performance write circuits.

Accordingly, there is a need for a write driver having a simple control circuit that speeds up the turn-on and turn-off times of the drive transistors without diminishing head swing and that reduces write current overshoot through the head and settling time without adversely affecting the rise/fall time of the write current.

SUMMARY OF THE INVENTION

The present invention is a circuit for switching a drive transistor in a write driver circuit controlled by a write control signal to direct write current in a selected direction through an inductive head. Current is selectively conducted from a control region of the drive transistor in response to switching of the write control signal. A bias subcircuit limits voltage fluctuation at the control region of the drive transistor.

According to one aspect of the invention, an active device is coupled to the control region of the drive transistor to selectively conduct the current from the control region. The bias subcircuit is coupled to the active device and the control region of the drive transistor to limit the voltage fluctuation at the control region.

In one embodiment, a second bias subcircuit is coupled to the drive transistor to operate the drive transistor to conduction in response to the write control signal and to prevent saturation of the drive transistor. In a further embodiment, the write driver circuit includes a second drive transistor and a second active device and second bias subcircuit are employed.

Another aspect of the present invention is a method of switching a drive transistor in a write driver circuit controlled by a write control signal to direct write current in a selected direction through an inductive head. Current is selectively conducted from a control region of the drive transistor in response to switching of the write control signal. A voltage fluctuation at the control region of the drive transistor is limited.

A further aspect of the present invention is a write driver circuit for supplying write current to an inductive write transducer having an inductive coil. A forward drive switch has a control region responsive to a forward control current to drive write current in a forward direction through the coil. A reverse drive switch has a control region responsive to a reverse control current to drive write current in a reverse direction through the coil opposite the forward direction. A control circuit is responsive to a write control signal to provide the forward and reverse control currents to the forward and reverse drive switches. A first bias subcircuit is connected to the control region of the forward drive switch to maintain a predetermined minimum voltage at the control region of the forward drive switch. A second bias subcircuit is connected to the control region of the reverse drive switch to maintain a predetermined minimum voltage at the control region of the reverse drive switch.

In one embodiment, the first bias subcircuit includes a first sink responsive to the control circuit for sinking forward control current from the forward drive switch, and the second bias subcircuit includes a second sink responsive to the control circuit for sinking reverse control current from the reverse drive switch.

DETAILED DESCRIPTION OF THE PREFERRED EMBODIMENTS

Figure 1:
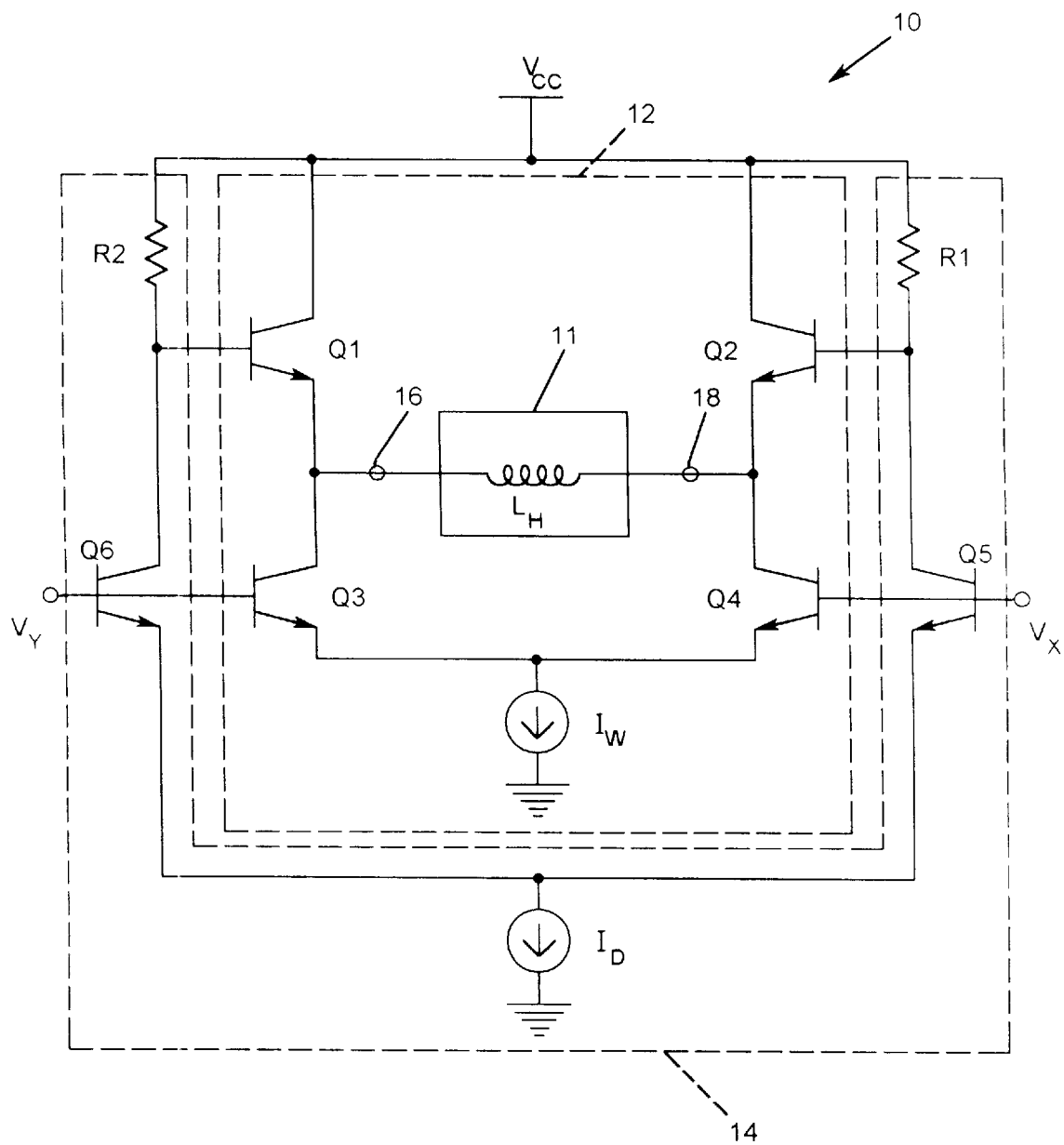
FIG. 1 is a schematic illustration of a conventional H-switch write driver circuit.
Figure 2:
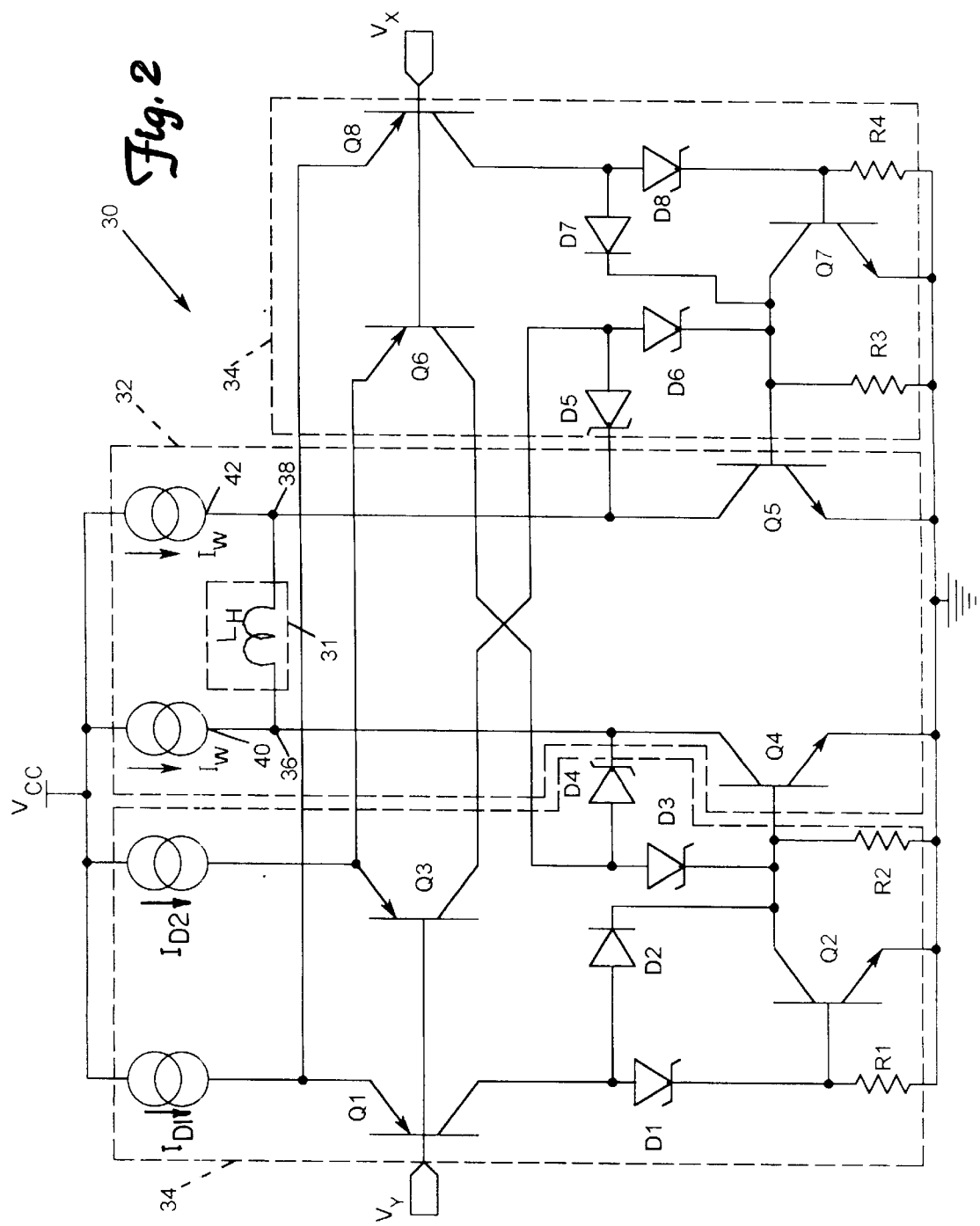
FIG. 2 is a schematic illustration of a write driver circuit according to the present invention.

FIG. 2 is a schematic illustration of write driver circuit 30 coupled to head 31 according to the present invention. Write driver 30 includes a switching drive circuit 32 and a differential control circuit 34. Switching drive circuit 32 is connected between voltage supply terminal $V_{CC}$ and a reference voltage such as ground, and includes two drive transistors Q4 and Q5, two head terminals 36 and 38, and two write current sources 40 and 42 each providing write current $I_W$. Transistor Q5 serves as a forward switch, and transistor Q4 serves a reverse switch.

Each of the two current sources 40 and 42 continually provides write current $I_W$. Write current $I_W$ is diverted through the inductive coil $L_H$ of head 31 by selectively controlling the states of drive transistors Q4 and Q5. When transistor Q4 is conducting and transistor Q5 is off, write current $I_W$ is diverted through inductive coil $L_H$, from terminal 38 to terminal 36, and a current equal to $2*I_W$ is sunk by transistor Q4. Conversely, when transistor Q5 is conducting and transistor Q4 is off, write current $I_W$ is diverted through inductive coil $L_H$ of head 31 from terminal 36 to terminal 38, and a current equal to $2*I_W$ is sunk by transistor Q5. By providing two sources of write current and selectively diverting the write current through head 31 by alternately operating drive transistors Q4 and Q5 as current sinks, drive circuit 32 is implemented with only lower switching drive transistors, eliminating the upper switching drive transistors present in conventional H-switch drive circuits. Thus, the switching limitations inherent in upper switching drive transistors are eliminated, improving the overall switching time of the system. Also, since only one forward switch and one reverse switch are used, problems of asymmetry due to imperfect synchronization of switching multiple forward and reverse switches are eliminated.

Write current sources 40 and 42 shown in FIG. 2 may be realized in a variety of ways. In an exemplary embodiment, a single write current source is provided, and a current mirror is configured to mirror the write current, effectively providing two write current supplies. This arrangement is shown in co-pending U.S. application Ser. No. 08/867,096 filed Jun. 2, 1997 by T. Ngo, entitled WRITE DRIVER USING CONTINUOUS DAMPING NETWORK TO REDUCE OVERSHOOT, UNDERSHOOT, AND SETTLING TIME FOR MAGNETIC INDUCTIVE RECORDING HEAD which is hereby incorporated by reference herein. Thus, the depiction of two separate write current sources 40 and 42 in FIG. 2 is illustrative only; drive circuit 32 does not necessarily require two independent current sources.

Differential control circuit 34 includes pre-driver current sources $I_{D1}$ and $I_{D2}$, control transistors Q1, Q3, Q6 and Q8, pull-down transistors Q2 and Q7, resistors R1, R2, R3 and R4, Schottky diodes D1, D3, D4, D5, D6 and D8, and diodes D2 and D7. Pre-driver current source $I_{D1}$ is connected between voltage supply terminal $V_{CC}$ and the respective emitters of transistors Q1 and Q8. Pre-driver current source $I_{D2}$ is connected between voltage supply terminal $V_{CC}$ and the respective emitters of transistors Q3 and Q6. Control input $V_Y$ is connected to the respective bases, or control regions, of transistors Q1 and Q3. Control input $V_X$ is connected to the respective bases of transistors Q6 and Q8. The respective anodes of Schottky diode D1 and diode D2 are connected to the collector of transistor Q1. The cathode of Schottky diode D1 is connected to the base of transistor Q2. The cathode of diode D2 is connected to the collector of transistor Q2. The emitter of transistor Q2 is connected to ground. Resistor R1 is connected between the base of transistor Q2 and ground. The collector of transistor Q2 is connected to the base of drive transistor Q4. Resistor R2 is connected between the base of transistor Q4 and ground. The cathode of Schottky diode D3 is connected to the base of transistor Q4. The cathode of diode D4 is connected to the collector of transistor Q4. The respective anodes of Schottky diodes D3 and D4 are connected to the collector of transistor Q6.

The respective anodes of Schottky diode D8 and diode D7 are connected to the collector of transistor Q8. The cathode of Schottky diode D8 is connected to the base of transistor Q7. The cathode of diode D7 is connected to the collector of transistor Q7. The emitter of transistor Q7 is connected to ground. Resistor R4 is connected between the base of transistor Q7 and ground. The collector of transistor Q7 is connected to the base of drive transistor Q5. Resistor R3 is connected between the base of transistor Q5 and ground. The cathode of Schottky diode D6 is connected to the base of transistor Q5. The cathode of diode D5 is connected to the collector of transistor Q5. The respective anodes of Schottky diodes D6 and D5 are connected to the collector of transistor Q3.

In an initial state of operation, control input $V_Y$ is in a high voltage state, and control input $V_X$ is in a low voltage state, for example. Thus, control transistors Q1 and Q3 are not conducting, or off, and control transistors Q6 and Q8 are conducting, or on. Pre-driver current $I_{D1}$ flows through transistor Q8, and pre-driver current $I_{D2}$ flows through transistor Q6. Current flowing from the collector of transistor Q6 proceeds to flow through Schottky diode D3, through resistor R2 to ground and into the base of drive transistor Q4. Thus, transistor Q4 conducts, or is turned on. Because control input $V_Y$ is high, and control transistor Q1 is off, no current flows through Schottky diode D1, resistor R1, or diode D2, and pull-down transistor Q2 is thereby not conducting, or off. Current flows from the collector of control transistor Q8 through diode D7 and Schottky diode D8. Current flows through resistor R4 to ground and also into the base of pull-down transistor Q7, turning it on. Current also flows into the collector of transistor Q7, through the emitter of transistor Q7 to ground, and through resistor R3 to ground.

Since transistor Q7 is conducting, its base-to-emitter voltage is equal to a diode junction drop (approximately 0.7 V, hereinafter "D"). Thus, the base of transistor Q7 is at a voltage level of D. The voltage at the collector of control transistor Q8 is one Schottky diode junction drop (approximately 0.4 V, hereinafter "$D_S$") above the base of transistor Q7, at $D+D_S$. The voltage at the collector of transistor Q7 is one diode junction drop below the voltage at the collector of transistor Q8, or $(D+D_S)-D=D_S$. Thus, the base-to-emitter voltage of drive transistor Q5 is equal to only $D_S$, which is not high enough to turn transistor Q5 on. Drive transistor Q5 is therefore not conducting, or off.

Since drive transistor Q4 is conducting and drive transistor Q5 is not conducting, write current $I_W$ from current source 40 is pulled directly through transistor Q4, and write current $I_W$ from current source 42 is diverted through head 31 from terminal 38 to terminal 36 and through transistor Q4 as well, so that a total current of $2*I_W$ is sunk by transistor Q4. Schottky diodes D3 and D4 are configured to keep drive transistor Q4 out of saturation, by ensuring that the collector-to-emitter voltage of transistor Q4 is maintained at approximately one diode junction drop (D).

Ideally, when write current is flowing in a given direction through head 31, the voltages at terminals 36 and 38 are equal, since an ideal inductive coil has no resistance. However, the inductive coil of head 31 is imperfect and has a resistance $R_H$ associated with it, so that the voltage across head 31 is equal to $I_W*R_H$. Because $R_H$ is quite small, the voltage across head 31 is also small, and the basic operation of write driver circuit 30 is not affected. Thus, when write current $I_W$ is flowing through head 31 in a given direction, the voltages at terminals 36 and 38 are approximately equal, and have values of D and $D+I_W*R_H$, since the collector of the drive transistor that is conducting current is held at a voltage equal to the voltage at its base (D) by respective Schottky diodes.

In order to reverse the direction of write current flow through the inductive coil $L_H$ of head 31, control input $V_Y$ is switched from a high voltage level to a low voltage level, and control input $V_X$ is switched from a low voltage level to a high voltage level. These switches in voltage levels turn control transistors Q1 and Q3 on, and turn control transistors Q6 and Q8 off.

Pre-driver current $I_{D1}$ flows through transistor Q1, and predriver current $I_{D2}$ flows through transistor Q3. Current flowing from the collector of transistor Q3 proceeds to flow through Schottky diode D6, through resistor R3 to ground and into the base of drive transistor Q5. Thus, transistor Q5 conducts, or is turned on. Because control input $V_X$ is high, and control transistor Q8 is off, no current flows through Schottky diode D8, resistor R4, or diode D7, and pull-down transistor Q7 is thereby turned off.

Current flows from the collector of control transistor Q1 through diode D2 and Schottky diode D1. Current flows through resistor R1 to ground and also into the base of pull-down transistor Q2, turning it on. Current also flows into the collector of transistor Q2, through the emitter of transistor Q2 to ground, and through resistor R2 to ground. Thus, transistor Q2 operates as a current sink, conducting current from the base of drive transistor Q4 to actively turn transistor Q4 off. The active sinking of base current from drive transistor Q4 turns it off more quickly than allowing the base current to passively discharge through resistor R2 to ground. Thus, the turn-off time of drive transistor Q4 is improved.

Since transistor Q2 is conducting, its base-to-emitter voltage is equal to a diode junction drop (D). Thus, the base of transistor Q2 is of a voltage level of D. The voltage at the collector of control transistor Q1 is one Schottky diode junction drop ($D_S$) above the base of transistor Q2 of $D+D_S$. The voltage of the collector of Transistor Q2 is one diode junction drop (D) below the voltage at the collector of transistor Q1, or $(D+D_S)-D=D_S$. Thus, the base-to-emitter voltage of drive transistor Q4 falls to $D_S$, turning it off.

In the initial state of operation described above, before switching input $V_X$ and $V_Y$, the base-to-emitter voltage of drive transistor Q5 was equal to $D_S$. After switching control inputs $V_X$ and $V_Y$, current is induced into the base of drive transistor Q5 to turn it on. The base-to-emitter voltage required to turn transistor Q5 on is equal to a diode junction drop (D), so that the voltage fluctuation, or swing at the base of transistor Q5 required to turn it on is $D-D_S$, or approximately 0.3–0.4 V. Because the base of transistor Q5 was not allowed to fully discharge to 0 V, less voltage swing is required to turn transistor Q5 on, improving the turn-on time of drive transistor Q5.

After switching, drive transistor Q5 is conducting and drive transistor Q4 is not conducting, so that write current $I_W$ from current source 40 is diverted through head 31 from terminal 36 to terminal 38 through transistor Q5, and write current $I_W$ from current source 42 is pulled directly through transistor Q5, so that a total current of $2*I_W$ is sunk by transistor Q5. Schottky diodes D5 and D6 are configured to keep drive transistor Q5 out of saturation, by ensuring that the collector-to-emitter voltage of transistor Q5 is maintained at approximately one diode junction drop (D).

Switching control input $V_Y$ from a low voltage level to a high voltage level and switching control input $V_X$ from a high voltage level to a low voltage level operates the circuit in reverse, to rapidly switch the direction of write current flow through head 31.

The write driver circuit of the present invention therefore simultaneously improves the turn-on and turn-off times of the respective drive transistors, and eliminates the upper drive transistors entirely. Specifically, the turn-on times of the drive transistors are improved by minimizing the voltage fluctuation, or swing, at the bases of the respective drive transistors between conducting and non-conducting states. The turn-off times of the drive transistors are improved by actively conducting current from the bases of the respective drive transistors. Switching times and overall performance of the write driver circuit are thereby enhanced by the present invention.

Although the present invention has been described with reference to preferred embodiments, workers skilled in the art will recognize that changes may be made in form and detail without departing from the spirit and scope of the invention.

What is claimed is:

1. A circuit for switching a first drive transistor in a write driver circuit having first and second drive transistors controlled by a write control signal to direct write current in selected direction through an inductive head, the circuit comprising:

an active device coupled to a control region of the first drive transistor to selectively conduct current from the control region of the first drive transistor and pull down a voltage at the control region of the first drive transistor in response to switching of the write control signal; and a diode circuit providing a lower limit for the voltage at the control region of the first drive transistor, the diode circuit being connected to a first resistor coupled between a control region of the active device and a first reference voltage, and including a first diode having a cathode coupled to the control region of the active device and a second diode having an anode coupled to an anode of the first diode and having a cathode coupled to the control region of the first drive transistor, wherein a difference between a voltage drop across the second diode and a voltage drop across the first diode establishes the lower limit for the voltage at the control region of the first drive transistor.

2. The circuit of claim 1, further comprising:
a bias subcircuit coupled to the first drive transistor to operate the first drive transistor to conduction in response to the write control signal and to prevent saturation of the first drive transistor.

3. The circuit of claim 2, wherein the bias subcircuit comprises a third diode having a cathode coupled to the control region of the first drive transistor, a fourth diode having an anode coupled to an anode of the third diode and having a cathode coupled to a collector region of the first drive transistor, and a second resistor coupled between the control region of the first drive transistor and a second reference voltage.

4. The circuit of claim 1, wherein the circuit further comprises:
a second active device coupled to a control region of the second drive transistor, the second active device selectively conducting current from the control region of the second drive transistor and pulling down a voltage at the control region of the second drive transistor in response to switching of the write control signal; and
a second diode circuit coupled to the second active device and the control region of the second drive transistor to establish a lower limit for the voltage at the control region of the second drive transistor, the second diode circuit being connected to a second resistor coupled between a control region of the second active device and a second reference voltage, and including a third diode having a cathode coupled to the control region of the second active device and a fourth diode having an anode coupled to an anode of the third diode and having a cathode coupled to the control region of the second drive transistor, wherein a difference between a voltage drop across the fourth diode and a voltage drop across the third diode establishes the lower limit for the voltage at the control region of the second drive transistor.

5. The circuit of claim 4, further comprising:
a second bias subcircuit coupled to the second drive transistor to operate the second drive transistor to conduction in response to the write control signal and to prevent saturation of the second drive transistor.

6. The circuit of claim 1, wherein the first diode is a Schottky diode and the second diode is a conventional diode.

7. The circuit of claim 3, wherein the third diode and the fourth diode are Schottky diodes.

8. The circuit of claim 4, wherein the third diode is a Schottky diode and the fourth diode is a conventional diode.

9. A write driver circuit for supplying write current to an inductive write transducer having an inductive coil, comprising:
a first drive transistor having a control region and first and second controlled regions, the first controlled region of the first drive transistor being connected to a first source of write current and arranged to be connected to a first side of the coil;
a second drive transistor having a control region and first and second controlled regions, the first controlled region of the second drive transistor being connected to a second source of write current and arranged to be connected to a second side of the coil opposite the first side, the second controlled region of the second drive transistor being connected to the second controlled region of the first drive transistor;
control means responsive to a write control signal to control the first and second drive transistors to drive write current through the coil in a selected forward or reverse direction;
first bias means connected to the control region of the first drive transistor to maintain a first predetermined minimum voltage at the control region of the first drive transistor; and
second bias means connected to the control region of the second drive transistor to maintain a second predetermined minimum voltage at the control region of the second drive transistor.

* * * * *